US005585302A

United States Patent [19]
Li

[11] Patent Number: 5,585,302
[45] Date of Patent: Dec. 17, 1996

[54] FORMATION OF POLYSILICON RESISTORS IN THE TUNGSTEN STRAPPED SOURCE/DRAIN/GATE PROCESS

[75] Inventor: Jia Li, San Antonio, Tex.

[73] Assignees: Sony Corporation, Tokyo, Japan; Sony Electronics, Inc., Park Ridge, N.J.

[21] Appl. No.: 513,404

[22] Filed: Aug. 10, 1995

[51] Int. Cl.⁶ .................................................. H01L 21/70
[52] U.S. Cl. .............................. 437/60; 437/47; 437/34; 437/236
[58] Field of Search ............................ 437/47, 60, 918, 437/34, 43, 228, 235, 236; 148/DIG. 136

[56] References Cited

U.S. PATENT DOCUMENTS

| | | | |
|---|---|---|---|
| 5,013,678 | 5/1991 | Winnerl et al. | 437/47 |
| 5,045,483 | 9/1991 | Delong et al. | 437/918 |
| 5,304,502 | 4/1994 | Hanagasaki | 437/918 |
| 5,356,826 | 10/1994 | Natsume | 437/918 |

OTHER PUBLICATIONS

M. Sekine, et al., "Self–Aligned Tungsten Strapped Source/ Drain and Gate Technology Realizing the Lowest Sheet Resistance for Sub–quarter Micron CMOS," IEDM 94, pp. 493–406.

Primary Examiner—Tuan H. Nguyen
Attorney, Agent, or Firm—Wood, Herron & Evans, P.L.L.

[57] ABSTRACT

A semiconductor device having tungsten strapped gate electrodes and source/drain regions and a polysilicon resistor. The gate electrodes and the polysilicon resistors are all formed from the same layer of polysilicon by initially coating the deposited polysilicon layer with an insulating layer and subsequently a layer of phosphorus doped silicon glass. The electrodes and resistor areas are formed by selectively etching the silicon glass and the polysilicon. This leaves the electrode polysilicon and the resistor polysilicon coated with the phosphorous doped glass. Spacers are then provided along the electrode and the glass removed only from above the gate electrode polysilicon leaving the resistor coated with the phosphorus doped silicon glass and silicon nitride. Tungsten then can be selectively deposited upon the gate electrode and along adjacent source and drain regions. This takes advantage of the use of selectively deposited tungsten over gate electrodes and at the same time eliminates the need to deposit separate polysilicon layers for the resistors.

7 Claims, 1 Drawing Sheet

FORMATION OF POLYSILICON RESISTORS IN THE TUNGSTEN STRAPPED SOURCE/DRAIN/GATE PROCESS

BACKGROUND OF THE INVENTION

In order to provide for shallower source/drain and gate electrodes with minimal sheet resistance, it has been proposed to employ self-aligned tungsten strapped source/drain and gate. For example, Sekine, et al. in *Self-aligned Tungsten Strapped Source/Drain and Gate Technology, Realizing the Lowest Sheet Resistance for Subquarter Micro CMOS* IEDM 94, pp 493–496 have set forth a method for forming such tungsten strapped source/drain and gate. This methodology used selective etching of phosphorus doped silicon glass followed by selective tungsten chemical vapor deposition to provide such self-aligned tungsten strapped source/drain and gate.

The problem with this technology is that it does not permit formation of polysilicon resistors on the same polysilicon layer as the gate electrode. The tungsten cladding over the gate polysilicon interferes with this process. Further, phosphorus in the phosphorus doped silicon glass can migrate into the silicon, altering its resistance. Therefore, in order to provide polysilicon resistors, a second polysilicon layer had to be employed with isolation layers and contacts.

SUMMARY OF THE INVENTION

Accordingly, it is an object of the present invention to provide a tungsten strapped source/drain and gate in combination with a polysilicon resistor wherein the gate electrode or electrodes and the resistors are all formed from the same polysilicon layer.

This objective is accomplished by depositing a polysilicon layer on a silicon wafer having an n-well and a p-well as well as gate and field oxide. Subsequently, the polysilicon layer is covered with an insulator layer, such as silicon dioxide, and thirdly, the phosphorus doped silicon glass. The electrodes, as well as the resistors, are then photolithographically defined. Spacers are provided for the electrodes and the phosphorus doped silica glass above the electrodes is selectively etched with hydrogen fluoride. Tungsten is then selectively deposited over exposed silicon, and thus deposits on the electrodes, as well as the source and drain regions, but not on the resistor. This provides a tungsten strapped polysilicon electrode and a polysilicon resistor both formed from the same polysilicon layer.

The objects and advantages of the present invention will be further appreciated in light of the following detailed description and drawings in which:

DETAILED DESCRIPTION

Figure 1:
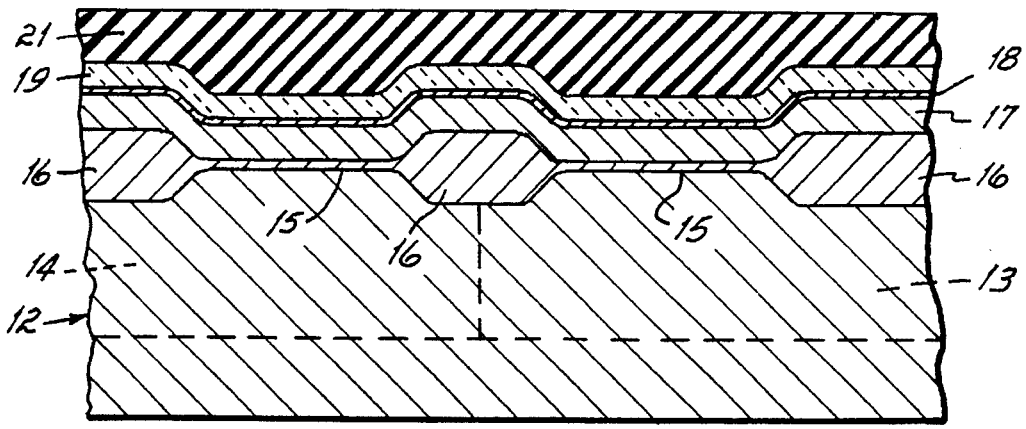
FIG. 1 is a cross-sectional, diagrammatic view of the first step of practicing the present invention.

The present invention provides a method of forming self-aligned tungsten strapped source/drain and gate electrodes in a layer of polysilicon wherein a resistor is also formed on the same polysilicon layer. Initially, a silicon wafer which has the p-well 13 and the n-well 14 along with the gate oxide areas 15 and field oxide areas 16, is coated with a layer of polysilicon 17. The substrate 12 itself can be silicon, silicon on an insulator, SIMOX or other substrates which are formed with the necessary n-well, p-well, and gate and field oxides and will generally be silicon.

The polysilicon layer 17 is deposited by known techniques, such as low pressure chemical vapor deposition. Amorphous silicon can be deposited and annealed at a temperature of 650° C. to form the polysilicon, if desired. The thickness of this layer can be varied depending upon application, and its particular thickness forms no particular part of the present invention. However, generally this will range from about 500 to 5,000 Å.

The polysilicon layer 17 is then coated with an insulating barrier layer 18. Preferably, this barrier layer will be silicon dioxide. Silicon dioxide can again be deposited by well known techniques, particularly low pressure chemical vapor deposition, or plasma enhanced chemical vapor deposition. The layer 18 is simply a barrier layer and is designed to keep phosphate from leaching into the polysilicon layer 17 and to act as the implant screening layer. Accordingly, it should generally be in the order of 100 Å. This can be increased or decreased, as desired, generally from 50 to 500 Å, but a thinner layer is generally preferred. After the barrier layer is established, group III or group V ions are implanted as necessary to establish the desired sheet resistance of the to be formed resistor.

The barrier layer 18 is then coated with a phosphorous doped silicon glass layer 19. This again can be deposited by well known techniques, and is generally deposited by atmospheric pressure chemical vapor deposition. The thickness of this layer 19 should equal the desired thickness of tungsten over the gate electrodes. Accordingly, its thickness will generally be in the neighborhood of 500 to 5,000 Å preferably less than 2,000 Å. Phosphorus doped silicon glass is employed because it is easily etched.

Finally, the phosphorous doped silicon glass layer is coated with a photoresist layer 21. Selection of the appropriate photoresist material is a matter of choice. Commercially produced photoresist materials are available and can be purchased, for example, from Hoechst Celanese Corporation or Shipley Corporation.

Figure 2:
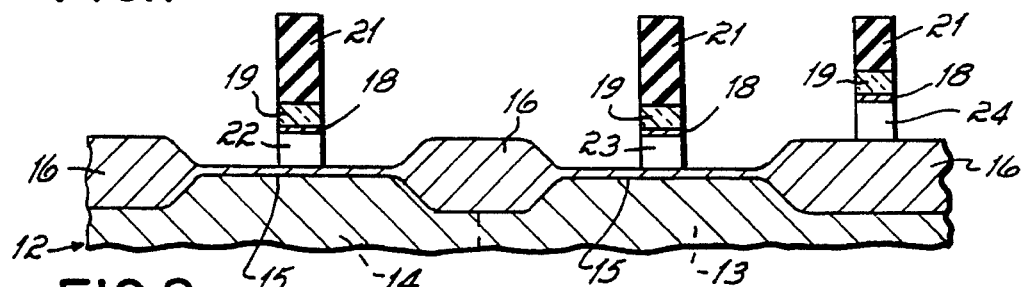
FIG. 2 is a cross-sectional, diagrammatic view of the second step of practicing the present invention.

As shown more particularly in FIG. 2, the photoresist layer 21 is selectively cured to protect the gate electrodes 22 and 23, as well as the polysilicon resistors 24 during the subsequent etching. Portions of the phosphorous doped silicon glass 19, and silicon oxide 18 covered by the photo mask 21 remain above the electrodes 22 and 23, and resistor 24. Etching should stop at the polysilicon/oxide interface after the polysilicon layer has been etched. The remaining photoresist material 21 is then removed by plasma etching.

The n channel areas are selectively implanted with ions from the group V elements to establish the lightly doped n channel source and drain areas 25 using photolithographic techniques. Again using photolithographic techniques, group III element ions are selectively implanted to establish the lightly doped p channel source and drain areas 26.

Figure 3:
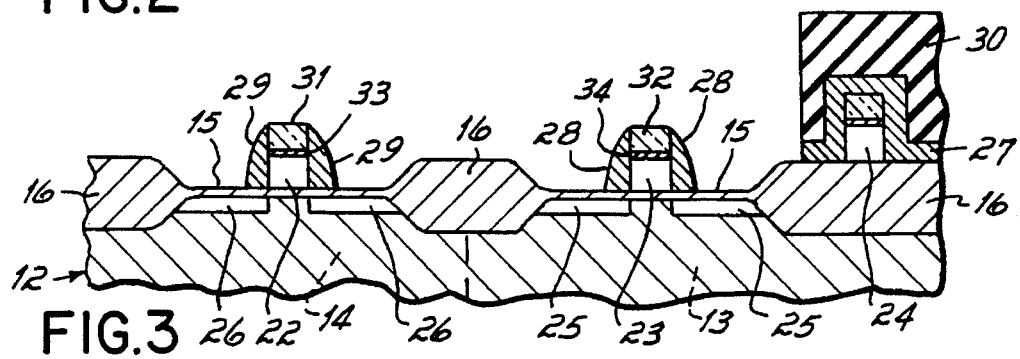
FIG. 3 is a cross-sectional, diagrammatic view of a third step of practicing the present invention.

A layer of silicon nitride 27 is deposited by chemical vapor deposition. Generally, the layer of silicon nitride has a thickness of about 1,000 Å to about 3,000 Å, preferably about 2,000 Å. As shown in FIG. 3, the silicon nitride layer 27 is then coated with a photoresist 30 and photolithographically defined so that the polysilicon resistor 24 is covered with photoresist 30. The nitride layer is etched anisotropically to form spacers 28 and 29 along side electrodes 22 and 23. Strips of the phosphorous doped silicon glass 31 and 32 remain above electrodes 22 and 23 separated from the polysilicon layer 22 and 23 by the silicon oxide layer 33 and 34, and sided by spacers 28 and 29.

Figure 4:
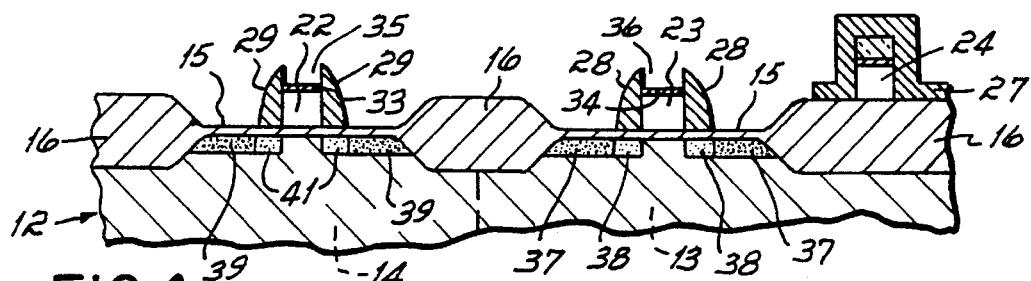
FIG. 4 is a cross-sectional, diagrammatic view of a subsequent step of practicing the present invention.

The photoresist material 30 remaining is then removed, and all exposed phosphorus doped silicon glass is removed with 100 percent hydrogen fluoride vapor. As shown in FIG. 4, this will leave channel areas 35 and 36 above the gate electrodes still coated with silicon dioxide areas 33 and 34. The n channel areas and p channel areas are then further implanted with group V elements and group III elements, leaving heavily doped n regions 37, and lightly doped n region 38 beneath spacer 28. Likewise, heavily doped p regions 39 are formed with lightly doped regions 41 beneath spacers 29. The wafer can then be annealed if so desired. The wafer is anisotropically etched to expose heavily doped silicon areas 37 and 39, as well as the gate electrodes 22 and 23.

Figure 5:
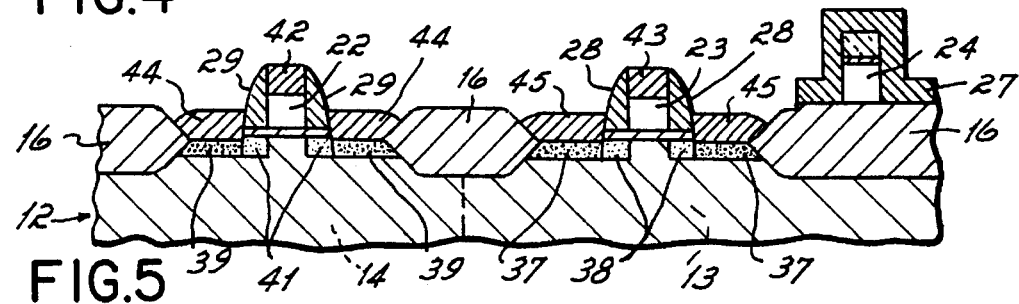
FIG. 5 is a cross-sectional, diagrammatic view of the end product of the present invention.

Tungsten is deposited using low pressure chemical vapor deposition onto the exposed silicon areas 37, 39, 22 and 23 as shown in FIG. 5. This can be conducted using standard techniques, such as reacting silane with tungsten hexafluoride at a flow ratio of 0.7 with a total pressure of 150 mTorr, and deposition temperature of 360° C. This provides for a deposition rate of 100 Å per minute. The tungsten layer should have the prior thickness of the PSG glass. Tungsten itself will only deposit on the exposed silicon layers, and thus will not coat the resistor layer which is separated by the silicon nitride layer 27.

This will provide tungsten straps 42 and 43 over electrodes 22 and 23 and tungsten straps 44 and 45 over highly doped areas 39 and 37, respectively. At this stage, the wafer includes the formed tungsten strapped source/drain and gate polysilicon electrodes, as well as the resistor, and all of these are formed from the same polysilicon layer. The wafer can then be further processed as desired or needed.

This present invention takes advantage of the low sheet resistance of tungsten strapped source/drain and gate electrodes and at the same time permits formation of resistors at the same level, i.e., without deposition of separate additional polysilicon layers. This assists in managing the size and complexity of the final circuit and supplies the manufacture of the circuit.

This of course has been a description of the present invention along with the preferred method of practicing the invention currently known to the inventor. However, the invention itself should only be defined by the appended claims wherein

We claim:

1. A method of forming a polysilicon resistor and tungsten strapped gate electrode on a substrate comprising coating said substrate with a layer of polysilicon, covering said polysilicon layer with an insulating layer, coating said insulating layer with a layer of phosphorous doped silicon glass and etching said phosphorous doped silicon glass, said insulating layer and said polysilicon layer to establish gate electrode polysilicon and resistor polysilicon both covered with a region of phosphorous doped silicon glass;

removing said phosphorous doped silicon glass and said insulating layer on said gate electrode polysilicon;

selectively depositing tungsten onto said gate electrode polysilicon without depositing said tungsten on said resistor.

2. The method claimed in claim 1 wherein said resistor is coated with a layer of silicon nitride prior to the selective deposition of tungsten.

3. The method claimed in claim 1 wherein a layer of silicon nitride is deposited and anisotropically etched to define spacers alongside said electrode and said region of phosphorous doped silicon glass and whereby said phosphorous doped silicon glass is subsequently removed using acid etching.

4. The method claimed in claim 1 wherein a plurality of electrodes are established from said polysilicon layer.

5. The method claimed in claim 4 further comprising establishing spacers along side said electrodes wherein a region of said phosphorus doped silicon glass and an insulating layer remains above said electrode polysilicon;

selectively removing said region of phosphorus doped glass and said insulating layer to establish a channel above said electrode polysilicon; wherein said tungsten is deposited in said channel.

6. The method claimed in claim 1 where said insulating layer is silicon dioxide.

7. A method of forming a polysilicon resistor and a tungsten strapped source/drain and gate electrode comprising coating a silicon substrate with a first insulating layer, a polysilicon layer and covering said polysilicon layer with a second insulating layer;

coating said second insulating layer with a layer of phosphorus doped silicon glass and etching said phosphorus doped silicon glass, said second insulating layer and said polysilicon layer to establish gate electrode polysilicon and resistor polysilicon;

selectively doping silicon substrate regions adjacent said gate electrode polysilicon to establish lightly doped source and drain regions;

establishing spacers alongside said gate electrode polysilicon wherein phosphorus doped silicon glass and said insulating layer remain above said gate electrode polysilicon, selectively removing said phosphorus doped silicon glass, and selectively doping said gate electrode polysilicon to saturation and doping at the same time regions adjacent said gate electrode polysilicon to establish heavily doped source and drain regions, removing said first and second insulating layers above said gate electrode polysilicon and source and drain regions to expose polysilicon and silicon, selectively depositing tungsten onto said source and drain regions and said gate electrode polysilicon without depositing said tungsten on said resistor.

* * * * *